United States Patent
Himeno et al.

[11] Patent Number: 6,150,712
[45] Date of Patent: Nov. 21, 2000

[54] LEAD FRAME FOR SEMICONDUCTOR DEVICE, AND SEMICONDUCTOR DEVICE

[75] Inventors: Yuji Himeno; Kouji Mizota, both of Oita, Japan

[73] Assignee: Sony Corporation, Tokyo, Japan

[21] Appl. No.: 09/226,123

[22] Filed: Jan. 7, 1999

[30] Foreign Application Priority Data

Jan. 9, 1998 [JP] Japan .................................. 10-002983

[51] Int. Cl.[7] .......................... H01L 23/495; H01L 23/48
[52] U.S. Cl. .......................... 257/677; 257/666; 257/787; 257/779; 257/696
[58] Field of Search .................................... 257/677, 666, 257/787, 779, 696

[56] References Cited

U.S. PATENT DOCUMENTS

| | | | |
|---|---|---|---|
| 4,942,454 | 7/1990 | Mori et al. | 257/696 |
| 5,041,901 | 8/1991 | Kitano et al. | 257/696 |
| 5,455,446 | 10/1995 | Suppelsa et al. | 257/666 |
| 5,616,953 | 4/1997 | King et al. | 257/666 |
| 5,994,767 | 11/1999 | Huang et al. | 257/666 |

FOREIGN PATENT DOCUMENTS

| | | | |
|---|---|---|---|
| 59-168659 | 9/1984 | Japan | 23/48 |
| 2-222567 | 5/1990 | Japan | 257/677 |
| 3-237750 | 10/1991 | Japan | 257/666 |
| 3-280565 | 11/1991 | Japan | 257/677 |
| 4-115558 | 4/1992 | Japan | 23/50 |
| 5-190727 | 7/1993 | Japan | 23/50 |

*Primary Examiner*—David Hardy
*Assistant Examiner*—Jhihan B. Clark
*Attorney, Agent, or Firm*—Ronald P. Kananen; Rader, Rishman & Grauer

[57] ABSTRACT

Disclosed are a lead frame for a semiconductor device, and a semiconductor device using the lead frame. Inner leads and outer leads of the lead frame are formed to have such a sectional structure that a film of Pd or a Pd alloy is formed on both surfaces or a rear surface of a lead frame directly or through an undercoat, and an Au-plated film is formed on a part of the film of Pd or a Pd alloy. Pd and Au are not applied to unnecessary areas, thus resulting in higher economical and production efficiency. The lead frame has good quality, is economical and has superior productivity. Wires connecting a semiconductor chip and the inner leads have a good connection property and joint portions of the outer leads to an external device also have a good connection property.

20 Claims, 3 Drawing Sheets

LEAD FRAME FOR SEMICONDUCTOR DEVICE, AND SEMICONDUCTOR DEVICE

BACKGROUND OF THE INVENTION

1. Field of the Invention

The present invention relates to a lead frame, e.g., a lead frame for a semiconductor device, and a semiconductor device using the lead frame. More particularly, the lead frame is connected to a semiconductor chip and is led out of the chip for connection to an external device.

2. Description of the Related Art

A lead frame for use in a resin-molded semiconductor device is required to meet that wires connecting a semiconductor chip and inner leads have a good wire bonding property, and joint portions of outer leads to an external device have good a soldering property.

For that reason, it has been hitherto customary to form a film of Pd (palladium) or a Pd alloy on an entire surface of a lead frame directly or through an undercoat, and then a thin film by Au (gold)-plating on the film of Pd or a Pd alloy.

Such an Au-plated film serves as a protective film for the film of Pd or a Pd alloy, and prevents the film of Pd or a Pd alloy from deteriorating due to oxidation. Also, even though formed thin, the Au-plated film is not adversely affected by the underlying film of Pd or a Pd alloy, and therefore can maintain a good soldering property specific to Au itself. Thus, characteristics of Pd and Au are exhibited to maximum, and a very good soldering property is achieved.

However, the above related art of forming the Au-plated film and the film of Pd or a Pd alloy on the entire lead frame is extremely uneconomical because expensive materials are used in excessive amount to cover even an area of a resin-molded semiconductor device where those films are not necessarily required.

Also, adhesion of the Au-plated film to a molding resin used in the resin-molded semiconductor device is so poor that a die pad and the resin tend to separate because of the presence of the Au-plated film. Therefore, cracks are more likely to occur in the resin covering corners of the die pad.

SUMMARY OF THE INVENTION

In view of the state of art set forth above, an object of the present invention is to provide a lead frame for a semiconductor device, which has good quality, is economical and has superior productivity while ensuring that wires connecting a semiconductor chip and inner leads have a good connection property and joint portions of outer leads to an external device also have a good connection property, as well as a semiconductor device using the lead frame.

As a result of conducting intensive studies with intent to achieve the above object, the inventors have found an effective solution and accomplished the present invention.

More specifically, the present invention provides a lead frame comprising a die pad, a guide rail, outer leads and inner leads, the lead frame having a material surface on which a film of a metal or a metal alloy is formed, wherein the film of a metal or a metal alloy is not formed on a rear surface of the die pad.

Also, the present invention provides a lead frame for a semiconductor device wherein a film of a metal or a metal alloy is formed on material surfaces of outer leads, and a gold film is formed on a part of the film of a metal or a metal alloy including portions of the outer leads which are to be subjected to soldering.

With the above features of the present invention, since a gold film is formed on a portion of the outer lead having a film of a metal or a metal alloy formed on its material surface, a gold film is not formed on an area where the gold film is not necessarily required, and therefore the lead frame of the present invention is economical. In addition, the manufacture process can be simplified and the productivity can be increased. Further, since the gold film is formed on a portion of the outer lead which is connected to an external device (i.e., which is subjected to soldering), it is possible to achieve a good soldering property and to prevent oxidation of the film of a metal or a metal alloy.

Still further, the present invention provides a lead frame for a semiconductor device wherein a film of a metal or a metal alloy is formed on a material surface of lead frame, and a gold film is formed on the film of a metal or a metal alloy only on a rear surface of the lead frame.

With the above features of the present invention, since a gold film is formed only on the rear surface of the lead frame having a film of a metal or a metal alloy formed on its material surface, economical and production efficiency can be further increased as compared with the above case of forming a gold film on a part of the film of a metal or a metal alloy.

Moreover, the present invention provides a semiconductor device comprising a lead frame with a semiconductor chip mounted on a die pad, the semiconductor chip being resin-molded in a condition electrically connected to inner leads of the lead frame, outer leads of the lead frame being extended out of a molding resin, wherein a film of a metal or a metal alloy is formed on a material surface of the lead frame, and a material surface of the die pad is not covered with the metal or the metal alloy in at least a rear surface of the die pad.

Also, the present invention provides a semiconductor device wherein a semiconductor chip is resin-molded in a condition electrically connected to inner leads of a lead frame, outer leads of the lead frame are extended out of a molding resin, a film of a metal or a metal alloy is formed on at least material surfaces of the outer leads, and a gold film is formed on a part of the film of a metal or a metal alloy including portions of the outer leads which are to be subjected to soldering.

With the above features of the present invention, since a gold film is formed on a part of the film of a metal or a metal alloy which is formed on the outer lead extended out of the molding resin, no metal films are present in a resin-molded area. The problems of peeling-off and cracking of the molding resin can therefore be avoided. In addition, a semiconductor device having similar advantages to those obtainable with the above-mentioned features can be provided.

Furthermore, the present invention provides a semiconductor device wherein a semiconductor chip is resin-molded in a condition electrically connected to inner leads of a lead frame, outer leads of the lead frame are extended out of a molding resin, a film of a metal or a metal alloy is formed on at least material surfaces of the outer leads, and a gold film is formed on the film of a metal or a metal alloy only on a rear surface of the lead frame.

With the above features of the present invention, since a gold film is formed only on the rear surface of the lead frame which is extended out of the molding resin and has a film of a metal or a metal alloy formed on its material surface, it is possible to provide a semiconductor device which has higher economical and production efficiency than the above semiconductor device, and also has similar advantages to those obtainable with the above-mentioned features.

The lead frame for a semiconductor device, and the semiconductor device according to the present invention are preferably implemented in the following forms. The Au-plated film is formed in areas of the lead frame other than the die pad and the guide rail, and the Au-plated film is formed on only the outer leads.

Then, the Au-plated film is formed only on a portion of the outer lead, which is to be subjected to soldering, and the vicinity thereof.

In that case, more preferably, a film of palladium or a palladium alloy is formed on the material surface of the lead frame directly or through an undercoat, and the gold film is formed by plating on a part of the film of palladium or a palladium alloy.

Additionally, the Au-plated film may be formed on a portion of the outer lead, which is to be subjected to soldering, and the vicinity thereof only on the rear surface of the lead frame. In this case, a film of palladium or a palladium alloy may be formed on the material surface of the lead frame directly or through an undercoat, and the gold film may be formed by plating on the film of palladium or a palladium alloy.

DESCRIPTION OF THE PREFERRED EMBODIMENTS

Preferred embodiments of the present invention will be described below in detail with reference to the drawings.

Figure 1:
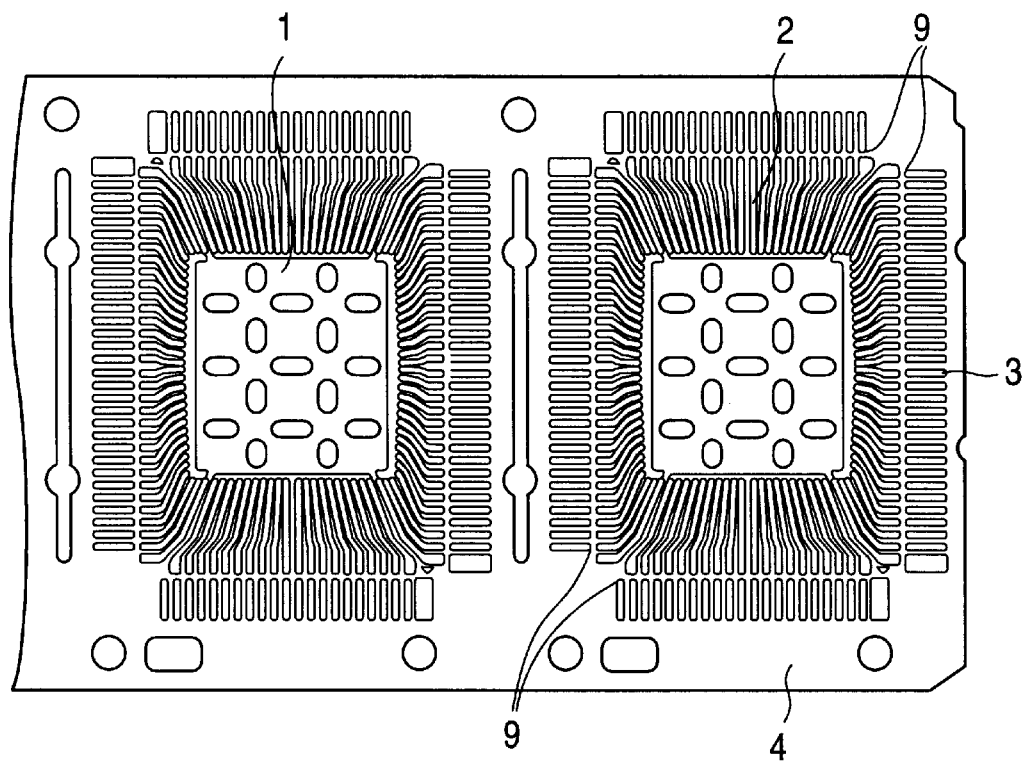
FIG. 1 is a plan view showing a part of a semiconductor device, which is under a manufacture stage, according to an embodiment of the present invention.

FIG. 1 is a plan view showing a part of a gull-wing type semiconductor device, according an embodiment of the present invention, under a manufacture stage in which a lead frame has been formed. The lead frame comprises a die pad 1, inner leads 2, outer leads 3, a guide rail 4, and tie bars 9.

In subsequent manufacture steps, such a semiconductor device is resin-molded over an area inside imaginary lines shown in FIG. 1 and cut in conformity with predetermined standards, thus resulting in a completed semiconductor device. The outer leads 3 are bent in conformity with predetermined standards, and distal ends of the outer leads 3 are connected to an external device, etc. by soldering or the like, as shown in FIG. 2.

Figure 2:
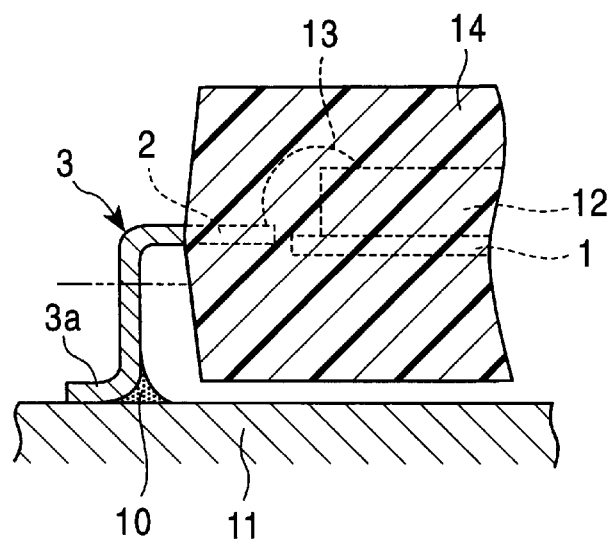
FIG. 2 is a fragmentary schematic sectional view showing connection between an outer lead extended from a semiconductor chip and a base plate in the semiconductor device.

FIG. 2 is a fragmentary schematic sectional view showing connection between the outer lead and a base plate in the semiconductor device according to the embodiment. More specifically, in FIG. 2, an IC chip 12 disposed on the die pad 1 is connected to the inner lead 2 by a bonding wire 13, and these members are sealed off by a molding resin 14. A lower surface of a bent distal end 3a of the outer lead 3 extending out of the molding resin 14 is connected to the base plate 11 by soldering or a solder 10.

Figure 3:
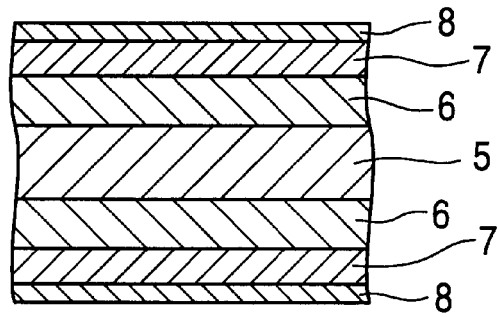
FIG. 3 is a sectional view showing one structure of a part of the outer lead in the semiconductor device.
Figure 4:
FIG. 4 is a sectional view showing a part of a die pad or a guide rail in the semiconductor device.

FIG. 3 shows a first embodiment of the lead frame. An essential feature of the first embodiment is illustrated in FIG. 3 which shows a sectional structure of a part of the outer lead 3 shown in FIG. 2. In the first embodiment, the die pad 1 and the guide rail 4 are each formed to have material surfaces exposed, as seen from a sectional view of FIG. 4. A film of Pd or a Pd alloy 7 is formed on only the inner lead 2 and the outer lead 3 directly or through an undercoat 6 on both sides. Then, a thin Au-plated film 8 is formed on the film 7 of Pd or a Pd alloy in a part of the outer lead 3 on both sides.

In the related-art structure, as described above, the film of Pd or a Pd alloy (corresponding to 7) is formed on the entire surfaces of the lead frame (5), the die pad (1) and the guide rail (4) directly or through the undercoat (6), and the thin Au-plated film (8) is then formed on the entire surface of the film (7) of Pd or a Pd alloy as with the section of FIG. 3. Comparing with the related-art structure, therefore, a total area of the film 7 of Pd or a Pd alloy and the Au-plated film 8 is much reduced in the first embodiment.

With the first embodiment, the following advantages are obtained. Since the Au-plated film 8 is not present on the die pad 1, adhesion between the die pad 1 and the molding resin 14 is improved, and wires connecting the semiconductor chip and the inner lead exhibit a better wire bonding property correspondingly. Also, since Pd and Au used on only the inner lead 2 and the outer lead 3, expensive Pd and Au are employed in smaller amount while ensuring a good soldering property. As a result, the lead frame according to the first embodiment can be manufactured more inexpensively than the lead frame in the related art.

Figure 6:
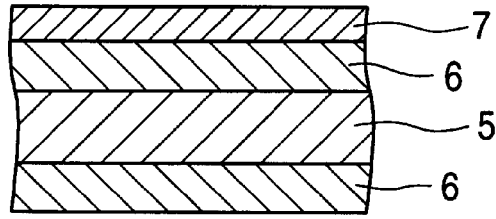
FIG. 6 is a sectional view showing another structure of a part of the inner lead in the semiconductor device.

Further, since the film of Pd or a Pd alloy is not formed on the die pad and the materials surfaces of the die pad are left exposed, it is also possible to avoid the problem that adhesion between the film of Pd or a Pd alloy on the die pad and the resin is reduced in the step of resin molding due to the presence of the film of Pd or a Pd alloy. With the surface of a material metal left exposed, a natural oxide film is formed on the metal material surface and adhesion between the die pad and the resin is eventually improved in the step of resin molding. From the viewpoint of improving adhesion between the die pad and the resin in the step of resin molding, the material surface of the die pad may be left exposed, without forming the film of Pd or a Pd alloy and the Au-plated film on the rear side. Additionally, when using a lead frame in which an underlying metal film of, e.g., Ni, for coating of a film of Pd or a Pd alloy is formed on the material surface of the lead frame, the resin molding may be performed in a condition where the film of Pd or a Pd alloy is not formed on at least a rear surface, as shown in FIG. 6, or both surfaces of a die pad. With this structure, adhesion between an oxide film produced on the underlying metal film and the molding resin is improved as compared with the case of the material surface being exposed; hence a more desired semiconductor device can be obtained.

Figure 7:
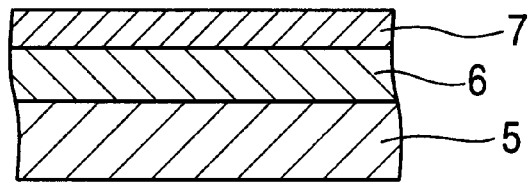
FIG. 7 is a sectional view showing still another structure of a part of the inner lead in the semiconductor device.

In the lead frame 5 according to the first embodiment, the Au-plated film 8 may be formed on the whole or a part (at least a portion which is to be connected by soldering) of only the outer lead 5. In this case, the inner lead 2 is formed to have a structure not including the Au-plated film 8 at the outermost. The structure of the inner lead 2 in this case may be modified as shown in FIGS. 6 and 7.

Figure 5:
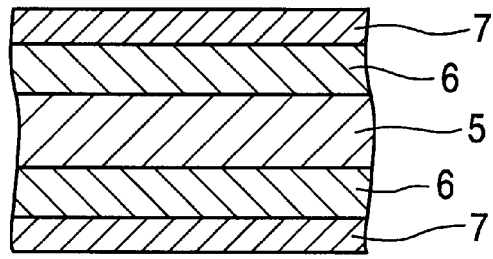
FIG. 5 is a sectional view showing one structure of a part of an inner lead in the semiconductor device.

More specifically, FIG. 5 shows a structure in which the films 7 of Pd or a Pd alloy are formed on both surfaces of the lead frame 5 through the undercoats 6. FIG. 6 shows a structure in which the undercoats 6 are formed on both surfaces of the lead frame 5 and the film 7 of Pd or a Pd alloy is formed on the surface of one of the undercoats 6. FIG. 7 shows a structure in which the film 7 of Pd or a Pd alloy is formed on only one surface of the lead frame 5 through the undercoat 6. In any of these structures, since the inner lead 2 does not include Au, the lead frame is further improved in economical efficiency.

Further, Au plating may be applied to only a portion of the outer lead 3 where soldering is to be performed in the mounting step. In this case, the undercoats 6 and the films 7 of Pd or a Pd alloy are formed on both surfaces of the lead frame 5 constituting the outer lead 3. The Au-plated film 8 is then formed on only a part of the outer lead 3 (for example, a portion of the outer lead 3 below an imaginary line in FIG. 2, i.e., a portion of the outer lead 3, which is to be connected by soldering, and the vicinity thereof). With this structure, since the Au-plated film is formed in a limited area where a good wetting property for soldering is to be provided, the soldering can be performed with a sufficient wetting property when the semiconductor device is mounted onto the base plate. In addition, a further saving of expensive Au can be achieved.

Figure 8:
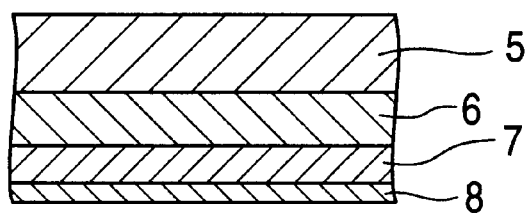
FIG. 8 is a sectional view showing another structure of a part of the outer lead in the semiconductor device.
Figure 9:
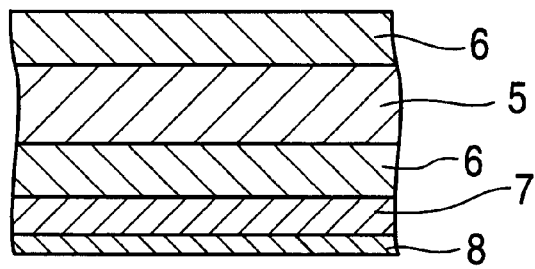
FIG. 9 is a sectional view showing still another structure of a part of the outer lead in the semiconductor device.
Figure 10:
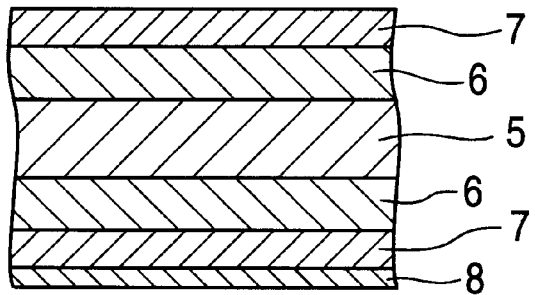
FIG. 10 is a sectional view showing still another structure of a part of the outer lead in the semiconductor device.

FIGS. 8 to 10 show a second embodiment of the lead frame. These drawings show, as an essential feature of the second embodiment, other forms of sectional structure of a part of the outer lead 3 in FIG. 2. The outer lead 3 has the same sectional structure on both sides in the first embodiment, whereas the sectional structure of the outer lead 3 in the second embodiment is asymmetrical on both sides.

In the structure of FIG. 8, the film 7 of Pd or a Pd alloy is formed on a lower surface (i.e., soldered surface) of the lead frame 5 through the undercoat 6, and the Au-plated film 8 is formed on the film 7 of Pd or a Pd alloy. The structure of FIG. 9 is the same as that of FIG. 8 except that the undercoats 6 are formed on both surfaces of the lead frame 5. In the structure of FIG. 10, the films 7 of Pd or a Pd alloy are formed on both surfaces of the lead frame 5 through the undercoats 6, and the Au-plated film 8 is formed on the film 7 of Pd or a Pd alloy only on the lower side as with the structure of FIG. 8.

Thus, in the lead frame according to the second embodiment, the Au-plated film 8 is formed on the whole or a part (for example, a portion which is to be connected by soldering and the vicinity thereof) of only the rear surface of the outer lead 3. In this case, the outer lead 3 is preferably structured as shown in any of FIGS. 8 to 10. Employing such a structure contributes to a saving of the amounts of Pd and Au used.

As described above, the embodiments are featured in that the Au-plated film 8 is not formed in portions of the lead frame where the Au-plated film is not necessarily required in the mounting step, with intent to cut down the cost. So long as Au is not plated, the lead frame may have any suitable structure of plated films. Note that while a gull-wing type semiconductor device is employed in the illustrated embodiments, the present invention is also similarly applicable to any other type of semiconductor device.

Also, with the above embodiments, since the Au-plated film is not present in the resin-molded area, adhesion of the lead frame to the molding resin is improved and better connection is achieved by die bonding between the semiconductor chip and the inner leads. The molding resin can be therefore avoided from peeling off or cracking. Further, with a reduction in the amounts of Pd and Au used, the production cost of the semiconductor device can be cut down. Thus, the Au-plated film is formed in the area where a good wetting property for soldering is to be provided, whereby the amounts of Pd and Au used can be lessened while a good wetting property is ensured.

According to the present invention, as described above, since a film of a metal or a metal alloy is formed on the material surface of a lead frame and a gold film is formed on a part of the film of a metal or a metal alloy, a gold film is not formed on an area where the gold film is not necessarily required, and therefore the lead frame of the present invention is economical. In addition, the manufacture process can be simplified and the productivity can be increased. Further, since the gold film is formed on at least a portion of an outer lead which is connected to an external device (i.e., which is subjected to soldering), it is possible to achieve a good soldering property and to prevent oxidation of the film of a metal or a metal alloy.

Also, when the present invention is applied to a semiconductor device, since no metal films are present in a resin-molded area, the problems of peeling-off between a die pad and a molding resin and cracking of the molding resin can be avoided. In addition, with improved adhesion of the lead frame to the molding resin, better connection between a semiconductor chip and inner leads can be achieved, and high-quality products having high reliability can be provided.

What is claimed is:

1. A lead frame comprising a die pad, a guide rail, outer leads and inner leads, said lead frame having a material surface on which a film of a metal or a metal alloy is formed, wherein said film of a metal or a metal alloy is not formed on at least a rear surface of said die pad,
wherein a gold film is formed on said film of a metal or a metal alloy.

2. A lead frame according to claim 1, wherein an undercoat is formed on the material surface of said lead frame before said film of metal or metal alloy is then formed on said undercoat.

3. A lead frame according to claim 1, wherein said metal is palladium.

4. A lead frame according to claim 1, wherein the material surface of said die pad is exposed over an entire surface of said die pad.

5. A lead frame according to claim 1, wherein a material surface of said guide rail is exposed.

6. A lead frame according to claim 1, wherein said film of a metal or a metal alloy is formed on an entire surface of said outer leads, and a gold film is formed on said film of a metal or a metal alloy.

7. A lead frame according to claim 1, wherein said film of a metal or a metal alloy is formed on an entire surface of said outer leads, and said gold film is formed on said film of a metal or a metal alloy, on a portion of said outer lead which is then soldered to said guide rail.

8. A lead frame comprising a die pad, a guide rail, outer leads and inner leads, said lead frame having a material surface on which a film of a metal or a metal alloy is formed, wherein a gold film is formed on said film of a metal or a metal alloy on only a rear surface of said lead frame.

9. A lead frame according to claim 8 wherein a semiconductor chip is mounted on said lead frame, said semiconductor device is resin-molded in a condition of said semiconductor chip being electrically connected to inner leads of said lead frame, and outer leads of said lead frame are extended out of a molding resin.

10. A lead frame according to claim 8, wherein said film of a metal or a metal alloy is formed on only the rear surface of said lead frame.

11. A lead frame according to claim 8, wherein an undercoat is formed on the material surface of said lead frame before said film of metal or metal alloy is then formed on said undercoat.

12. A lead frame according to claim 8, wherein said metal is palladium.

13. A semiconductor device comprising a lead frame with a semiconductor chip mounted on a die pad, said semiconductor chip being resin-molded in a condition electrically connected to inner leads of said lead frame, outer leads of said lead frame being extended out of a molding resin, wherein a film of a metal or a metal alloy is formed on a material surface of said lead frame, and a material surface of said die pad is not covered with said metal or said metal alloy in at least a rear surface of said die pad, wherein a gold film is formed on said film of a metal or a metal alloy.

14. A semiconductor device according to claim 13, wherein an undercoat is formed on the material surface of said lead frame before said film of metal or metal alloy is then formed on said undercoat.

15. A semiconductor device according to claim 13, wherein said metal is palladium.

16. A semiconductor device according to claim 13, wherein the material surface of said die pad is exposed over an entire surface of said die pad.

17. A semiconductor device according to claim 13, wherein a material surface of said guide rail is exposed.

18. A semiconductor device according to claim 13, wherein said film of a metal or a metal alloy is formed on an entire surface of said outer leads, and a gold film is formed on said film of a metal or a metal alloy.

19. A lead frame comprising a die pad, a guide rail, outer leads and inner leads, said lead frame having a material surface on which a film of a metal or a metal alloy is formed, wherein a gold film is formed on said film of a metal or a metal alloy on only a rear surface of said lead frame, wherein an undercoat is formed on the material surface of said lead frame before said film of metal or metal alloy is then formed on said undercoat.

20. A lead frame comprising a die pad, a guide rail, outer leads and inner leads, said lead frame having a material surface on which a film of a metal or a metal alloy is formed, wherein a gold film is formed on said film of a metal or a metal alloy on only a rear surface of said lead frame, wherein said metal is palladium.

* * * * *